(12) United States Patent
England

(10) Patent No.: US 11,037,906 B2
(45) Date of Patent: Jun. 15, 2021

(54) 3D IC PACKAGE WITH RDL INTERPOSER AND RELATED METHOD

(71) Applicant: GLOBALFOUNDRIES U.S. Inc., Santa Clara, CA (US)

(72) Inventor: Luke G. England, Saratoga Springs, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/447,335

(22) Filed: Jun. 20, 2019

(65) Prior Publication Data

US 2019/0304954 A1 Oct. 3, 2019

Related U.S. Application Data

(62) Division of application No. 15/882,036, filed on Jan. 29, 2018, now Pat. No. 10,388,631.

(51) Int. Cl.
*H01L 23/00* (2006.01)
*H01L 23/498* (2006.01)
(Continued)

(52) U.S. Cl.
CPC .... *H01L 25/0657* (2013.01); *H01L 21/31053* (2013.01); *H01L 21/32133* (2013.01);
(Continued)

(58) Field of Classification Search
CPC . H01L 25/0657; H01L 21/4857; H01L 24/81; H01L 23/49816; H01L 23/49833;
(Continued)

(56) References Cited

U.S. PATENT DOCUMENTS 7,855,101 B2   12/2010   Furman et al.
9,099,541 B2 *  8/2015   Kim ................. H01L 23/481
(Continued)

OTHER PUBLICATIONS

Jourdain et al., "Collective Hybrid Bonding for 3D IC Stacks," Solid State Technology Insights for Electronics Manufacturing, Dec. 13, 2017, 8 pages.
(Continued)

*Primary Examiner* — David Vu
(74) *Attorney, Agent, or Firm* — Anthony Canale; Hoffman Warnick LLC

(57) ABSTRACT

A 3D IC package includes a bottom die having a back interconnect side opposing a front device side, the back interconnect side having a plurality of bottom die interconnects extending thereto. A top die has a front device side opposing a back side, the front device side having a plurality of top die interconnects. An interposer includes a redistribution layer (RDL) between the bottom die and the top die, the RDL including a plurality of wiring layers extending from back side RDL interconnects thereof to front side RDL interconnects thereof. An under bump metallization (UBM) couples the back side RDL interconnects to the plurality of top die interconnects at a first location, and the front side RDL interconnects are coupled to the plurality of bottom die interconnects at a second location. The first location and second location may not overlap.

8 Claims, 11 Drawing Sheets

(51) Int. Cl.
*H01L 25/065* (2006.01)
*H01L 21/683* (2006.01)
*H01L 21/48* (2006.01)
*H01L 25/00* (2006.01)
*H01L 21/3213* (2006.01)
*H01L 21/3105* (2006.01)
*H01L 21/78* (2006.01)
*H01L 21/56* (2006.01)

(52) U.S. Cl.
CPC ...... *H01L 21/4853* (2013.01); *H01L 21/4857* (2013.01); *H01L 21/6835* (2013.01); *H01L 21/78* (2013.01); *H01L 23/49816* (2013.01); *H01L 23/49822* (2013.01); *H01L 23/49833* (2013.01); *H01L 24/03* (2013.01); *H01L 24/16* (2013.01); *H01L 24/81* (2013.01); *H01L 24/89* (2013.01); *H01L 24/97* (2013.01); *H01L 25/50* (2013.01); *H01L 21/563* (2013.01); *H01L 2221/68345* (2013.01); *H01L 2221/68359* (2013.01); *H01L 2224/05025* (2013.01); *H01L 2224/16227* (2013.01); *H01L 2224/802* (2013.01); *H01L 2224/80006* (2013.01); *H01L 2224/80009* (2013.01); *H01L 2224/80895* (2013.01); *H01L 2224/80896* (2013.01); *H01L 2224/81191* (2013.01); *H01L 2225/06517* (2013.01); *H01L 2225/06541* (2013.01); *H01L 2225/06568* (2013.01); *H01L 2225/06572* (2013.01); *H01L 2225/06586* (2013.01); *H01L 2924/14* (2013.01)

(58) Field of Classification Search
CPC ... H01L 24/16; H01L 24/03; H01L 21/31053; H01L 21/32133; H01L 24/97; H01L 25/50; H01L 21/4853; H01L 21/6835; H01L 24/89; H01L 23/49822; H01L 2924/14; H01L 2224/16227; H01L 2225/06572; H01L 2225/06568; H01L 2225/06586; H01L 2225/06517; H01L 2224/80896; H01L 2224/80895; H01L 2221/68345; H01L 2224/802; H01L 2224/80009; H01L 2225/06541; H01L 2224/80006; H01L 2221/68359; H01L 2224/81191; H01L 2224/05025
See application file for complete search history.

(56) References Cited

U.S. PATENT DOCUMENTS

| | | | |
|---|---|---|---|
| 9,412,661 | B2 | 8/2016 | Lu et al. |
| 9,490,167 | B2* | 11/2016 | Chen .................... H01L 25/105 |
| 9,768,048 | B2 | 9/2017 | Lin et al. |
| 2010/0081232 | A1 | 4/2010 | Furman et al. |
| 2014/0131856 | A1 | 5/2014 | Do et al. |
| 2015/0371938 | A1 | 12/2015 | Katkar et al. |
| 2017/0139142 | A1* | 5/2017 | Patel .................... G02B 6/305 |

OTHER PUBLICATIONS

U.S. Appl. No. 15/882,036, Notice of Allowance dated May 1, 2019, 14 pages.

* cited by examiner

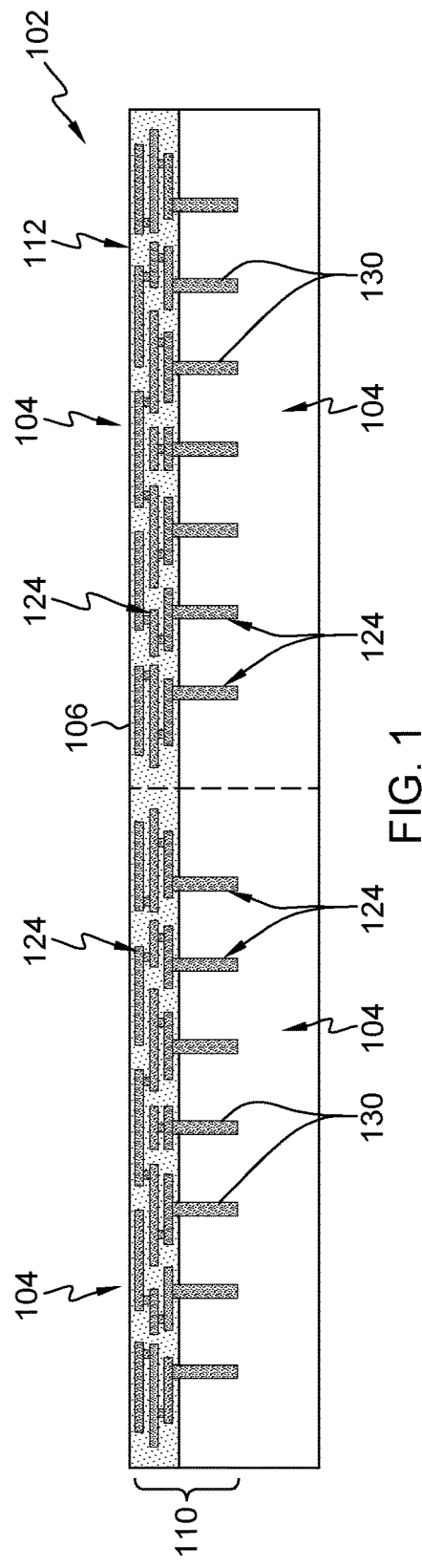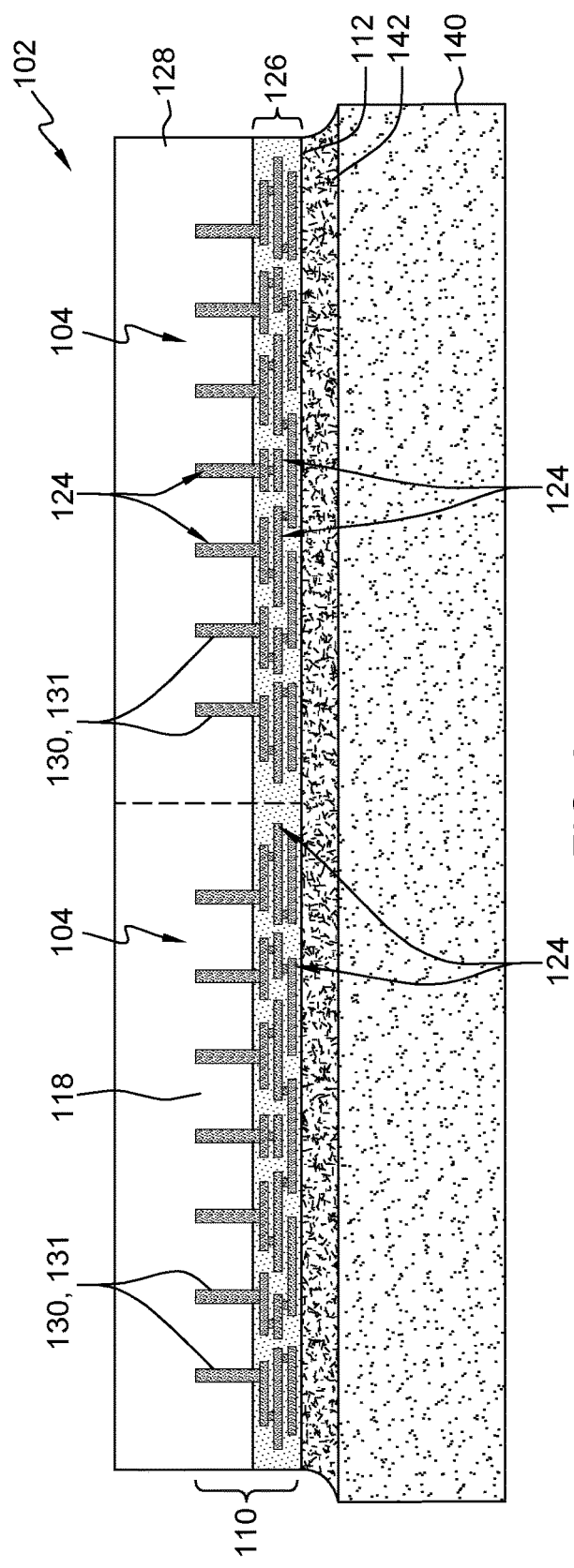

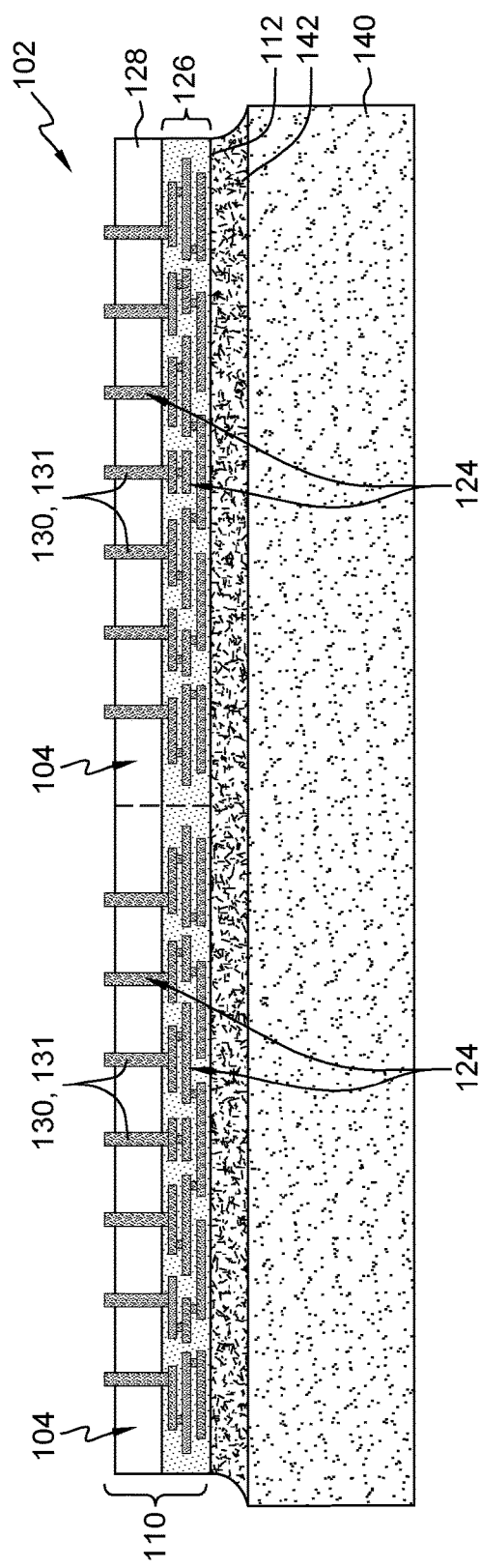
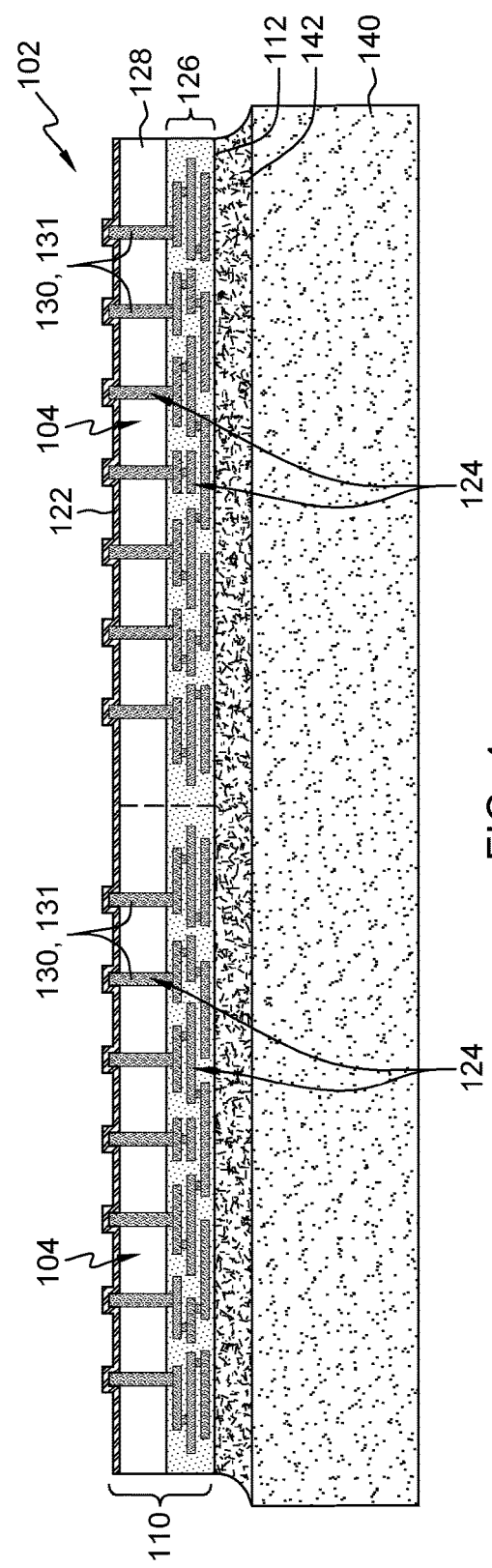

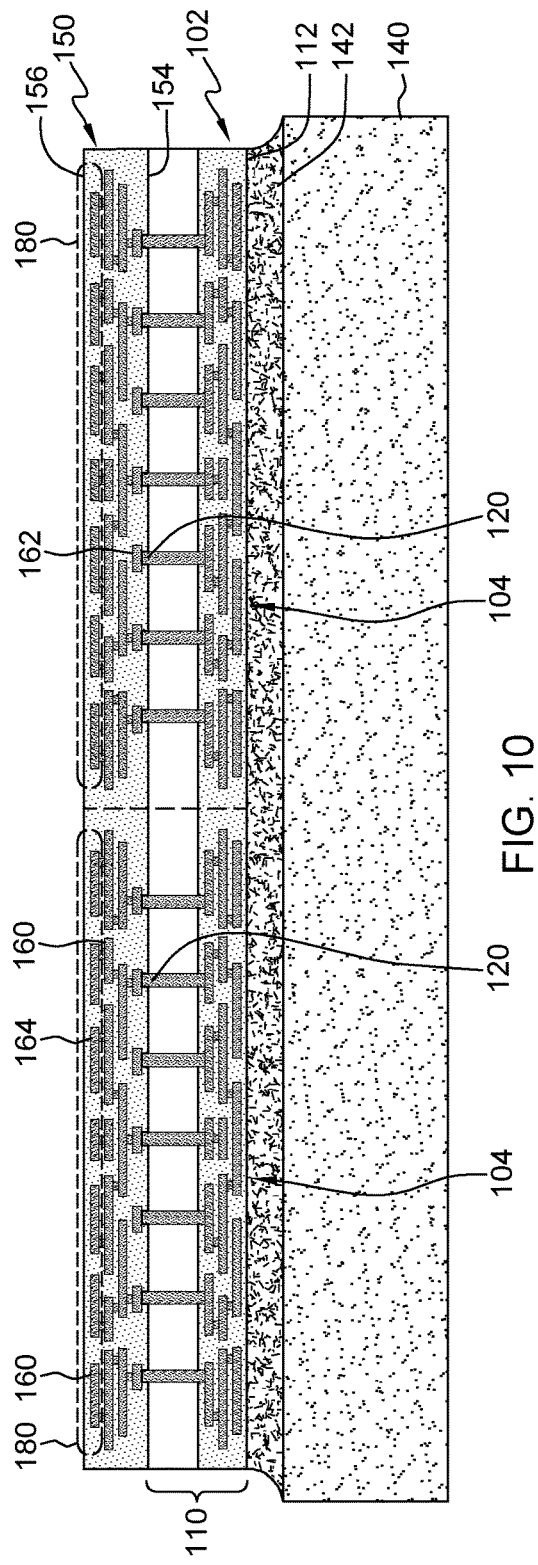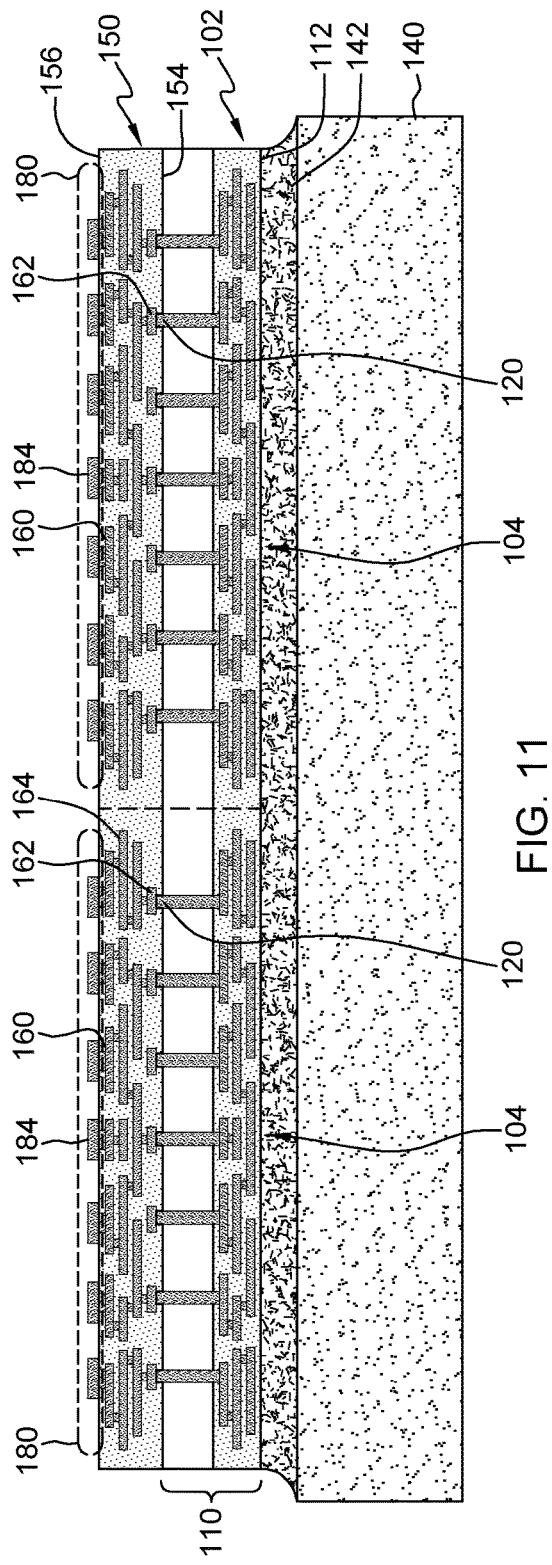

3D IC PACKAGE WITH RDL INTERPOSER AND RELATED METHOD

CROSS-REFERENCE TO RELATED APPLICATIONS

This application is a divisional of U.S. application Ser. No. 15/882,036, filed on Jan. 29, 2018, currently pending and hereby incorporated by reference in its entirety.

BACKGROUND

The present disclosure relates to integrated circuit (IC) packaging, and more specifically, to a three dimensional (3D) IC package with an interposer including a redistribution layer between a top and bottom IC die, and a related method of forming same.

Integrated circuits (IC) are formed in semiconductor wafers during front end of line (FEOL) processing in a semiconductor fab, i.e., up to a first metallization layer over the IC devices. Back end of line (BEOL) processing is any processing performed on the semiconductor wafer in the course of device manufacturing following first metallization, e.g., to enlarge the wiring for interconnection to other devices.

3D IC packages typically are formed by electrically coupling a front side of an IC top die to a back side of an IC bottom die with some interconnections therebetween. Wiring layers on the back side of a bottom die/wafer, which are connected to through semiconductor via (TSV) connections through that bottom die, are limited to wires with line-space dimensions of about 8 to 10 micrometers. The limitation is based on lithography processing capability while the thin bottom wafer is mounted face down on a temporary handler wafer, as part of the three dimensional through semiconductor via (3D/TSV) interconnect processing. Warpage of the thin wafer on the temporary handler wafer prevents high resolution lithography imaging. In addition, the pitch of the TSV connections through the bottom die/wafer to the back side wiring are limited in placement by the minimum line-space dimensions of this wiring layer. In many cases, the pitch requirements of the micropillar interconnects on the front side of a top die to which the TSV interconnects of the bottom die must couple, e.g., of about 30 to 40 micrometers, drive the TSV placement pitch of the bottom die. Larger pitch TSV placements consume larger amounts of area that cannot be used for other circuitry, which is undesirable due to the high cost of advanced node logic wafers. The current line-space limitation of 8 to 10 micrometers for the backside wiring layer of the bottom die only allows partial shrinkage of the TSV footprint. In order to fully reduce the impact of the TSV footprint, a line-space of 1 micron or less is desired.

One approach to create smaller wire dimensions for the bottom die during back side wiring processing is to re-introduce the wafer with the carrier wafer thereon into the fab in which the ICs were made, and then form additional, smaller wiring layers. However, this approach is logistically challenging because current IC fabrication tools are not configured to handle temporary carrier wafers, and those tools typically reside in clean areas with higher levels of particle and other contamination restrictions. Another challenge with mating IC dies is the desire to create a larger number of interconnections between the dies. It is possible to create larger numbers of TSVs connecting to the back side of the bottom die in a small area to increase the number of connections, but there is currently no way to enlarge (fan out) the TSVs to mate with current micropillar spacing on the top die. Another challenge with current 3D IC packaging is that the interconnects of the two dies must be mated in aligned or overlapped fashion.

SUMMARY

A first aspect of the disclosure is directed to a method of forming a three dimensional (3D) integrated circuit (IC) package, the method comprising: providing an IC bottom die wafer including a plurality of IC bottom dies therein, each IC bottom die having a back interconnect side opposing a front device side, the back interconnect side having a plurality of exposed bottom die interconnects surrounded by a back side dielectric layer; coupling a first carrier to the front device side of the IC bottom die wafer; creating an interposer including a redistribution layer (RDL) for each IC bottom die in the IC bottom die wafer, the interposer having a front side, a back side and a second carrier coupled to the back side thereof, the RDL including a plurality of wiring layers, the wiring layers extending from back side RDL interconnects on the back side of the interposer to front side RDL interconnects on the front side of interposer; hybrid bonding the front side of the interposer to the back side of the IC bottom die wafer, wherein for each respective IC bottom die, at least a portion of the front side RDL interconnects operatively couple to the plurality of exposed bottom die interconnects of the respective IC bottom die at a first location of the respective IC bottom die; removing the second carrier from the interposer, exposing the back side RDL interconnects at a second location; forming an under bump metallization (UBM) on the exposed back side RDL interconnects at the second location; removing the first carrier and dicing the IC bottom die wafer with the interposer into the plurality of IC bottom dies, each IC bottom die including a respective RDL of the interposer and a respective UBM; providing an IC top die including a plurality of top die interconnects; and forming the 3D IC package by coupling the plurality of top die interconnects of the IC top die to the UBM on a selected IC bottom die.

A second aspect of the disclosure includes a three dimensional (3D) integrated circuit (IC) package, comprising: an IC bottom die having a back interconnect side opposing a front device side, the back interconnect side having a plurality of bottom die interconnects extending thereto; an IC top die having a front device side opposing a back side, the front device side having a plurality of top die interconnects; an interposer including a redistribution layer (RDL) between the IC bottom die and the IC top die, the RDL including a plurality of wiring layers extending from back side RDL interconnects thereof to front side RDL interconnects thereof; an under bump metallization (UBM) coupling the back side RDL interconnects to the plurality of top die interconnects at a first location, and wherein the front side RDL interconnects are coupled to the plurality of bottom die interconnects at a second location.

A third aspect of the disclosure related to a three dimensional (3D) integrated circuit (IC) package, comprising: an IC bottom die having a back interconnect side opposing a front device side, the back interconnect side having a plurality of through semiconductor vias (TSVs) exposed therein; an IC top die having a front device side, the front device side having a plurality of micropillars exposed therein; an interposer including a redistribution layer (RDL) between the IC bottom die and the IC top die, the RDL including a plurality of wiring layers extending from back side RDL interconnects thereof to front side RDL interconnects thereof; and an under bump metallization (UBM) coupling the back side RDL interconnects to the plurality of top die interconnects at a first location, wherein the front side RDL interconnects are coupled to the plurality of bottom die interconnects at a second location, and wherein the back side RDL interconnects have a larger pitch than the front side RDL interconnects.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 1 shows a cross-sectional view of a step or steps of a method for making a 3D IC package according to embodiments of the disclosure.

FIG. 2 shows a cross-sectional view of a step or steps of a method for making a 3D IC package according to embodiments of the disclosure.

FIG. 3 shows a cross-sectional view of a step or steps of a method for making a 3D IC package according to embodiments of the disclosure.

FIG. 4 shows a cross-sectional view of a step or steps of a method for making a 3D IC package according to embodiments of the disclosure.

FIG. 10 shows a cross-sectional view of a step or steps of a method for making a 3D IC package according to embodiments of the disclosure.

FIG. 11 shows a cross-sectional view of a step or steps of a method for making a 3D IC package according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a 3D IC package. The bottom die has a back interconnect side opposing a front device side, the back interconnect side having a plurality of bottom die interconnects such as through semiconductor vias (TSVs) extending thereto. The top die has a front device side opposing a back side, the front device side having a plurality of top die interconnects such as micropillars. The 3D IC package includes the bottom and top die with both of their front device sides facing in the same direction, e.g., downwardly. This arrangement is in contrast to conventional packages that have front device sides facing one another connected with coarse pitch, copper pillars. The 3D IC package also includes an interposer including a redistribution layer (RDL) between the bottom die and the top die. The RDL includes a plurality of wiring layers extending from back side RDL interconnects thereof to front side RDL interconnects thereof. An under bump metallization (UBM) couples the back side RDL interconnects to the plurality of top die interconnects at a first location, and the front side RDL interconnects are coupled to the plurality of bottom die interconnects at a second location. The front side RDL interconnections can have a different pitch or number than the back side RDL connections. Thus, the RDL allows for routing of and fanning out of the bottom die TSVs, regardless of their number or pitch, to accommodate practically any micropillar arrangement on the top die. Embodiments of the method of forming the 3D IC package do not require re-introduction of parts into a fab. Further, the first location and second location of interconnection may not overlap. Accordingly, as will be described, the package can accommodate positioning of interconnects in other than an aligned fashion between the two dies, which allows for, among other benefits, a potential reduction in overall footprint.

Referring to FIGS. 1-13, a method of forming a 3D IC package 100 (FIG. 13) according to embodiments of the disclosure will be described. Each figure shows a cross-sectional view of a step or steps of the process.

Figure 5:
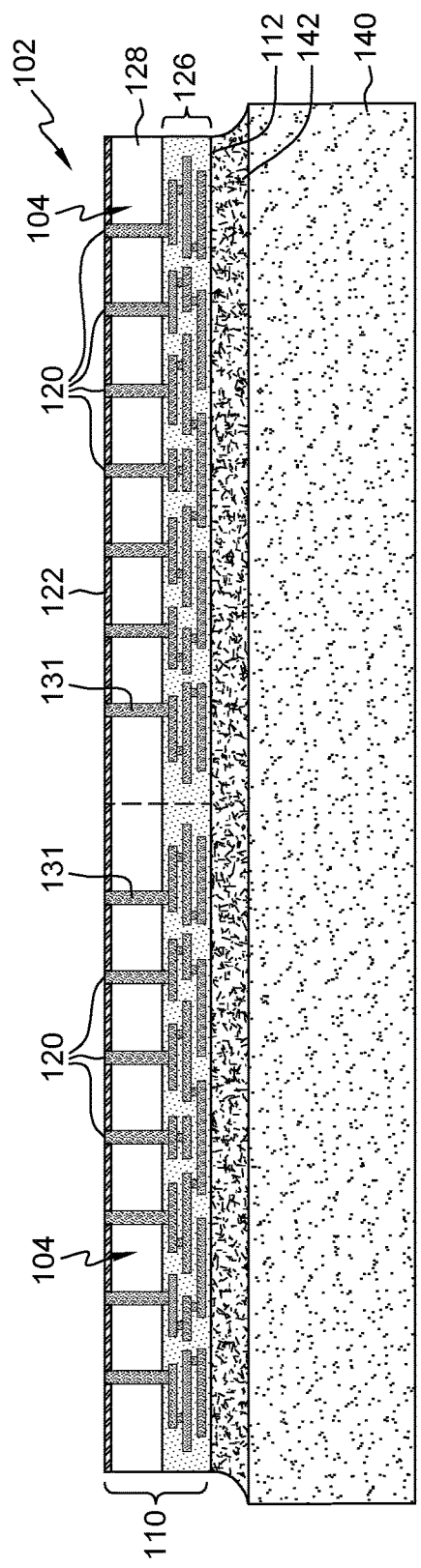
FIG. 5 shows a cross-sectional view of a step or steps of a method for making a 3D IC package according to embodiments of the disclosure.
Figure 6:
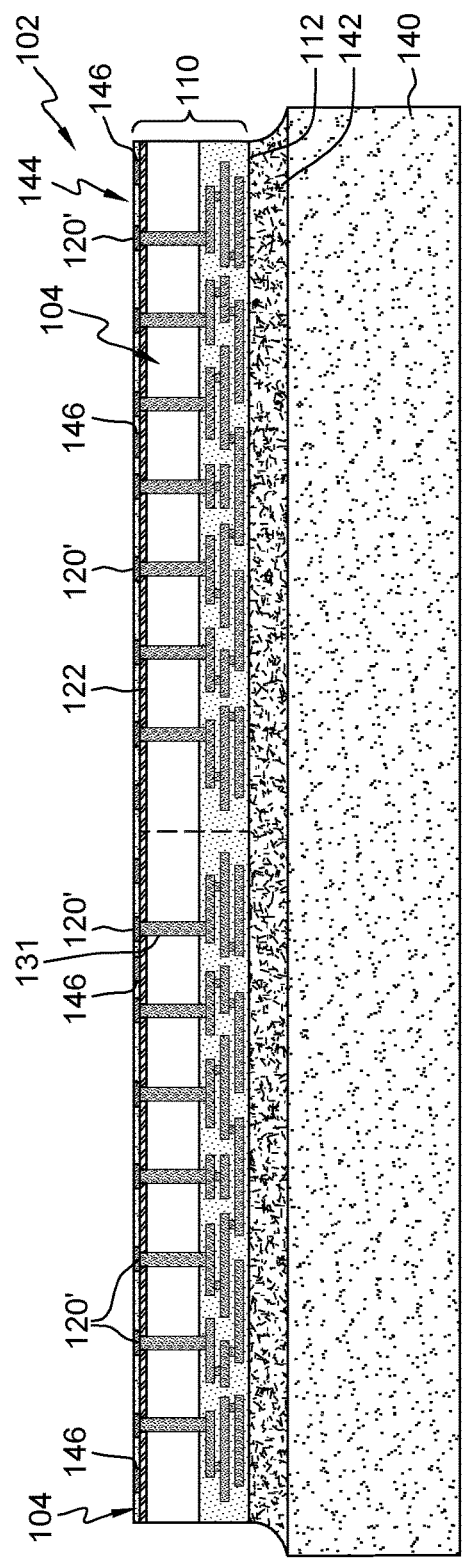
FIG. 6 shows a cross-sectional view of a step or steps of a method for making a 3D IC package according to embodiments of the disclosure.

FIGS. 1-6 show providing an IC bottom die wafer 102 that includes a plurality of IC bottom dies 104 therein. Eventual separation locations of IC bottom dies 104 are shown by phantom, dashed line. Each IC bottom die 104 has a back interconnect side 110 opposing a front device side 112. Each IC bottom die 104 may include any now known or later developed complementary metal oxide semiconductor (CMOS) device. Front device side 112 may include any now known or later developed CMOS devices. As shown in FIGS. 5 and 6, IC bottom die wafer 102 is provided such that back interconnect side 110 has a plurality of exposed bottom die interconnects 120 surrounded by a back side dielectric layer 122. Back side dielectric layer 122 may include any inorganic dielectric, e.g., an oxide, appropriate for hybrid bonding, as further described herein. As will be described further, the bottom die interconnects that eventually form exposed bottom die interconnects 120 can vary. In the FIG. 5 example, exposed bottom die interconnects 120 are through semiconductor vias (TSVs). As will be apparent from the description, they may take other forms, e.g., regular vias, metal wires, etc.

Referring to FIG. 1, IC bottom die wafer 102 may be fabricated using any now known or later developed technology, e.g., photolithography. As understood in the art, front device side 112 includes active devices of bottom dies 104 therein such as transistors, resistors, capacitors, etc. These devices (not shown) are very small (e.g., nanometers) and located in an outermost substrate layer(s) 106 of bottom die wafer 102, as shown in FIG. 1. Substrate layer(s) 106 (FIG. 1 only) may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Back interconnect side 110 may have a variety of bottom die interconnects 124 in a number of different layers therein. In the examples shown, back interconnect side 110 may include a back end of line (BEOL) interconnect section 126 including any number of conventional BEOL metal layers and via layers (not separately labeled) formed in dielectric layer(s) (not separately labeled) using any now known or later developed processes, e.g., damascene or dual damascene processing. BEOL interconnect section 126 couples to the devices in front device side 112 in each bottom die 104 in a conventional fashion. Dielectric layers (not separately labeled) of BEOL interconnect section 126 may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Conductors that form the metal or via layers in BEOL interconnect section 126 may include for example, copper or aluminum, with any appropriate liner layers necessary such as titanium nitride. As understood, each progressive metal and via layer in BEOL interconnect section 126 may be larger than the one below to scale up the size of the interconnects.

With reference to FIGS. 1-5, in one embodiment, back interconnect side 110 may also include a back side semiconductor layer 128 having outermost bottom die interconnects 130 therein. Outermost bottom die interconnects 130 are coupled to interconnects in BEOL interconnect section 126. In the example shown, outermost bottom die interconnects 130 in back side semiconductor layer 128 may include TSVs 131, e.g., of copper.

FIG. 2 shows coupling a first carrier 140 to front device side 112 of IC bottom die wafer 102 (to FIG. 1 embodiment). First carrier 140 may include, for example, silicon or a glass, and may be coupled to front device side 112 by any now known or later developed adhesive 142. The thickness of adhesive 142 may vary depending on the form of structure of front device side 112.

FIGS. 3-5 show the process of creating exposed bottom die interconnects 120 within back side dielectric layer 122. FIG. 3 shows etching to reveal an extent of plurality of bottom die interconnects 130, i.e., TSVs 131, of each IC bottom die 104 on back interconnect side 110 of IC bottom die wafer 102. Here, outer extents of TSVs 131 may be revealed to, for example, approximately 5 micrometers above the semiconductor surface, using, for example, a dry etch removal of semiconductor layer 128 (e.g., silicon). TSVs 131 may still have their oxide liners (not shown) at this stage. Etching generally refers to the removal of material from a substrate (or structures formed on the substrate), and is sometimes performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching. In the instant case, a blanket semiconductor dry etch removal that is selective to the TSV oxide liner may be used (no mask is employed).

FIG. 4 shows depositing back side dielectric layer 122 over the extents of plurality of bottom die interconnects 130, 131. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, CVD may be appropriate.

As noted herein, back side dielectric layer 122 may include any inorganic dielectric, e.g., an oxide, appropriate for hybrid bonding, as further described herein. FIG. 5 shows planarizing back side dielectric layer 122 and plurality of bottom die interconnects 130, creating exposed bottom die interconnects 120, i.e., exposed TSVs 131 with back side dielectric layer 122 thereabout. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins;

(viii) low-viscosity liquid epoxies; (ix) spin-on glass (SOG) materials; and/or (x) sacrificial etch-back. As shown in FIG. 5, bottom dies 104 include a plurality of exposed bottom die interconnects 120, i.e., TSVs 131, surrounded by back side dielectric layer 122.

FIG. 6 shows an optional embodiment of adding a pad layer 144 on IC bottom die wafer 102, on exposed bottom die interconnects 120. Pad layer 144 may be connected to exposed bottom die interconnects, e.g., TSVs 131, to create further exposed bottom die interconnects 120' at an outermost surface thereof. Pad layer 144 may be desirable where, for example, dummy pads 146 are need to promote planarity, e.g., using CMP. Pad layer 144 may be made using any now known or later developed process, e.g., a single Damascene process. A dielectric layer of pad layer 144 may be of the same material as back side dielectric layer 122, e.g., an oxide.

Figure 7:
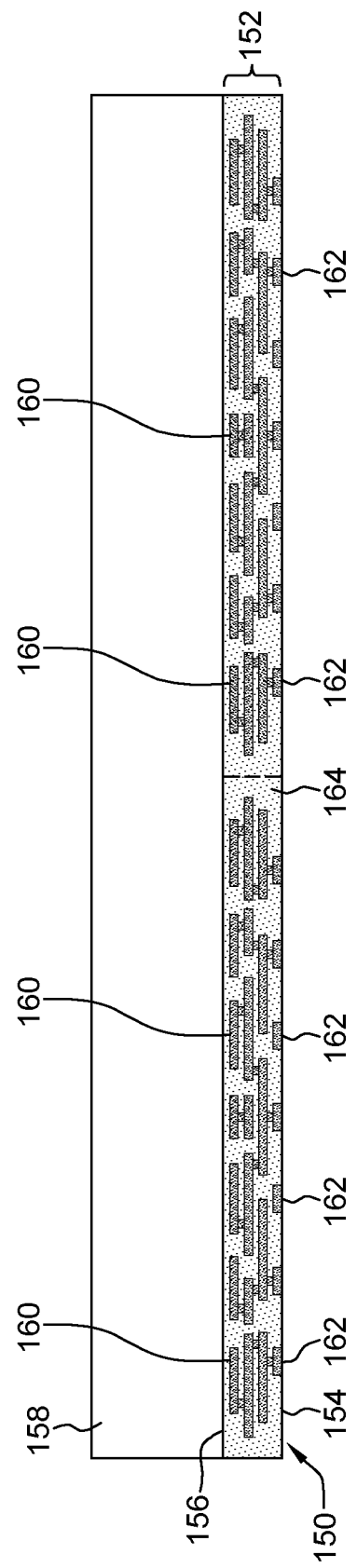
FIG. 7 shows a cross-sectional view of a step or steps of a method for making a 3D IC package according to embodiments of the disclosure.

FIG. 7 shows creating an interposer 150 including a redistribution layer (RDL) 152 for each IC bottom die 104 (e.g., FIG. 5) in IC bottom die wafer 102. Interposer 150 includes a front side 154 and a back side 156. A second carrier 158 is coupled to back side 156 thereof. Second carrier 158 may include any of the previously described materials of first carrier 140 (FIG. 5). RDL 152 may include a plurality of wiring layers (not labeled) extending from back side RDL interconnects 160 on back side 156 of interposer 150 to front side RDL interconnects 162 on front side 154 of interposer 150. Wiring layers are formed within dielectric layer(s) 164 (not individually labeled), and may include laterally extending wire layers and/or vertical via layers, i.e., any form of BEOL wiring. Outermost dielectric layers 164 include an inorganic dielectric appropriate for hybrid bonding, e.g., an oxide. As illustrated, back side RDL interconnects 160 may have a larger pitch than front side RDL interconnects 162. In this fashion, as will be described, front side RDL interconnects 162 may have a pitch configured to mate with TSVs 131 of each bottom die 104 (FIG. 5), and back side RDL interconnects may have a pitch configured to mate with top die interconnects such as micropillars that have a larger pitch than TSVs 131.

Figure 8:
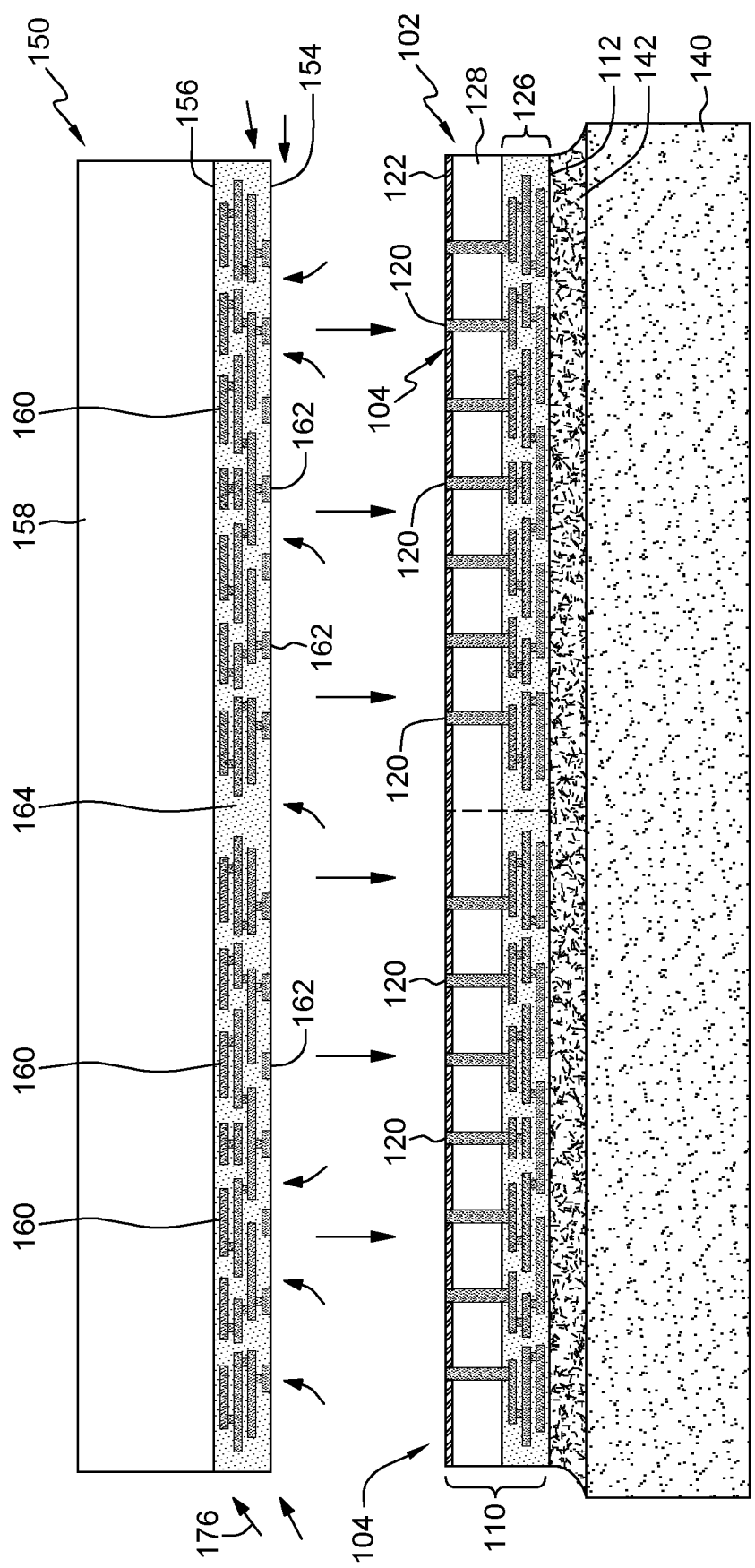
FIG. 8 shows a cross-sectional view of a step or steps of a method for making a 3D IC package according to embodiments of the disclosure.
Figure 9:
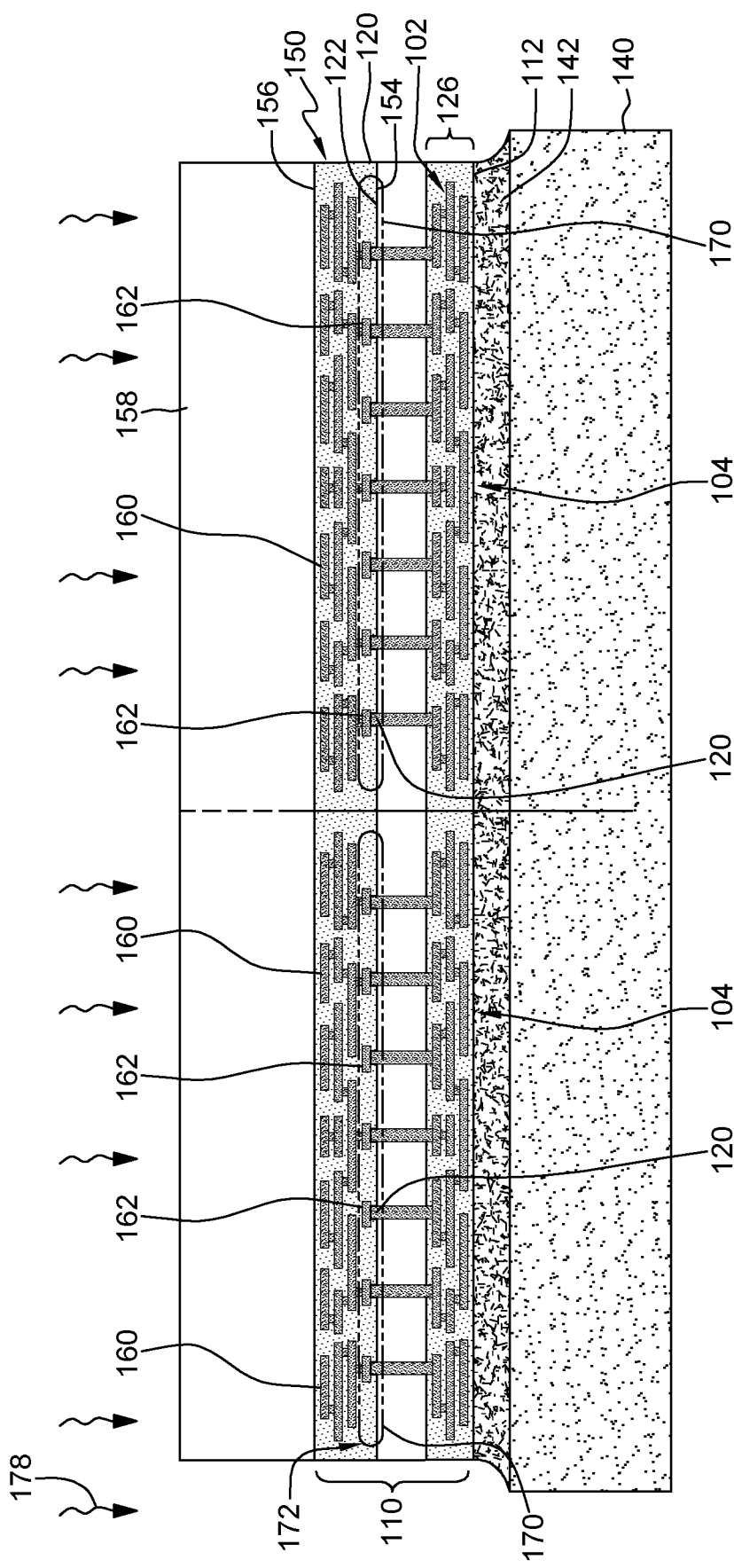
FIG. 9 shows a cross-sectional view of a step or steps of a method for making a 3D IC package according to embodiments of the disclosure.

FIGS. 8 and 9 show hybrid bonding front side 154 of interposer 150 to back interconnect side 110 of IC bottom die wafer 102. For each respective IC bottom die 104, at least a portion of front side RDL interconnects 162 operatively couple to plurality of exposed bottom die interconnects 120 of the respective IC bottom die 140 at a first location 170 (within circle) of respective IC bottom die 104. The hybrid bonding includes using a copper-oxide layer 172 (FIG. 9) formed from back side dielectric layer 122 and dielectric layer 164 of interposer 150 and conductors 120, 162, i.e., of copper, therein. The hybrid bonding may include any now known or later developed processing. In one embodiment, shown in FIG. 8, the hybrid bonding may include plasma activating 176 back side dielectric layer 122 about plurality of exposed bottom die interconnects 120 and dielectric layer 164 about front side RDL interconnects 162 of interposer 150. FIG. 9 shows contacting front side 154 of interposer 150 to back interconnect side 110 of IC bottom die wafer 102, bonding back side dielectric layer 122 to dielectric layer 164 about front side RDL interconnects 162 of interposer 150. That is, creating copper-oxide layer 172. As understood in the art, the plasma activation creates dangling hydroxide (OH) bonds on dielectric layers 122 and 164, which results in an adhesion between back side dielectric layer 122 and dielectric layer 164 upon contact, i.e., via van der Waals forces. Hybrid bonding may also include, as shown in FIG. 9, annealing 178 to cause front side RDL interconnects 162 to diffuse with their corresponding plurality of exposed bottom die interconnects 120. The anneal may be at any temperature and duration for the particular metals or metal alloys of the interconnects, e.g., copper.

FIG. 10 shows removing second carrier 158 (FIG. 9) from interposer 150, exposing back side RDL interconnects 160 at a second location 180 (within circle). Depending on the material, second carrier 158 (FIG. 9) may be removed in a number of ways. For example, where second carrier 158 includes bulk silicon, it can be removed by backgrinding to remove most of the bulk silicon layer, and dry or wet etching to remove final silicon layer and expose back side RDL interconnects 160.

FIG. 11 shows forming an under bump metallization (UBM) 184 on exposed back side RDL interconnects 160 at second location 180. UBM 184 may be formed using any now known or later developed process. In one example, via openings may be etched into dielectric layer 164 to allow contact to back side RDL interconnects 160, and then UBM 184 formed on back side RDL interconnects 160 in a conventional fashion, typically through photolithography patterning electroplating of an appropriate UBM metallurgy in the patterned area, followed by stripping the photoresist and plating seed layers. UBM 184 may include any appropriate conductor material, (e.g., copper, nickel, etc.) appropriate for back side RDL interconnects 160 (e.g., of copper) and the anticipated solder to a top die 190 (FIG. 13), e.g., tin, tin-silver, tin-lead, etc.

Figure 12:
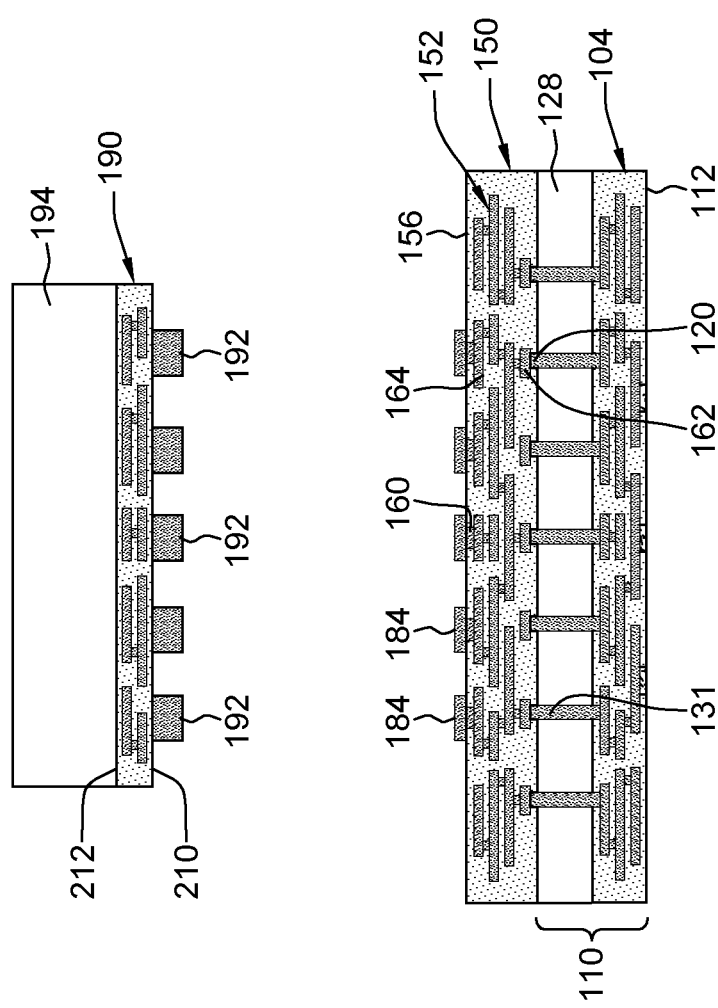
FIG. 12 shows a cross-sectional view of a step or steps of a method for making a 3D IC package according to embodiments of the disclosure.

FIG. 12 shows removing first carrier 140 (FIG. 11) from IC bottom die wafer 102 (FIG. 12), and dicing IC bottom die wafer 102 (FIG. 11) with interposer 150 into plurality of IC bottom dies 104 (only one shown). First carrier 140 (FIG. 11) may be removed, for example, using any of the processes described for removing second carrier 158 (FIG. 9). IC bottom die wafer 102 may be diced using any now known or later developed dicing process, e.g., using a blade, laser, or plasma. Each IC bottom die 104 includes a respective RDL 152 of interposer 150 and a respective UBM 184. FIG. 12 also shows providing an IC top die 190 including a plurality of top die interconnects 192. Top die interconnects 192 may take any now known or later developed forms. In one embodiment, shown in FIG. 12, plurality of top die interconnects 192 of IC top die 190 may include a micropillar arrangement configured to electrically couple to UBM 184 of a selected IC bottom die 104. Top die 190 may take any of a large variety forms such as but not limited to: CMOS, microelectromechanical system (MEMS), or memory.

Figure 13:
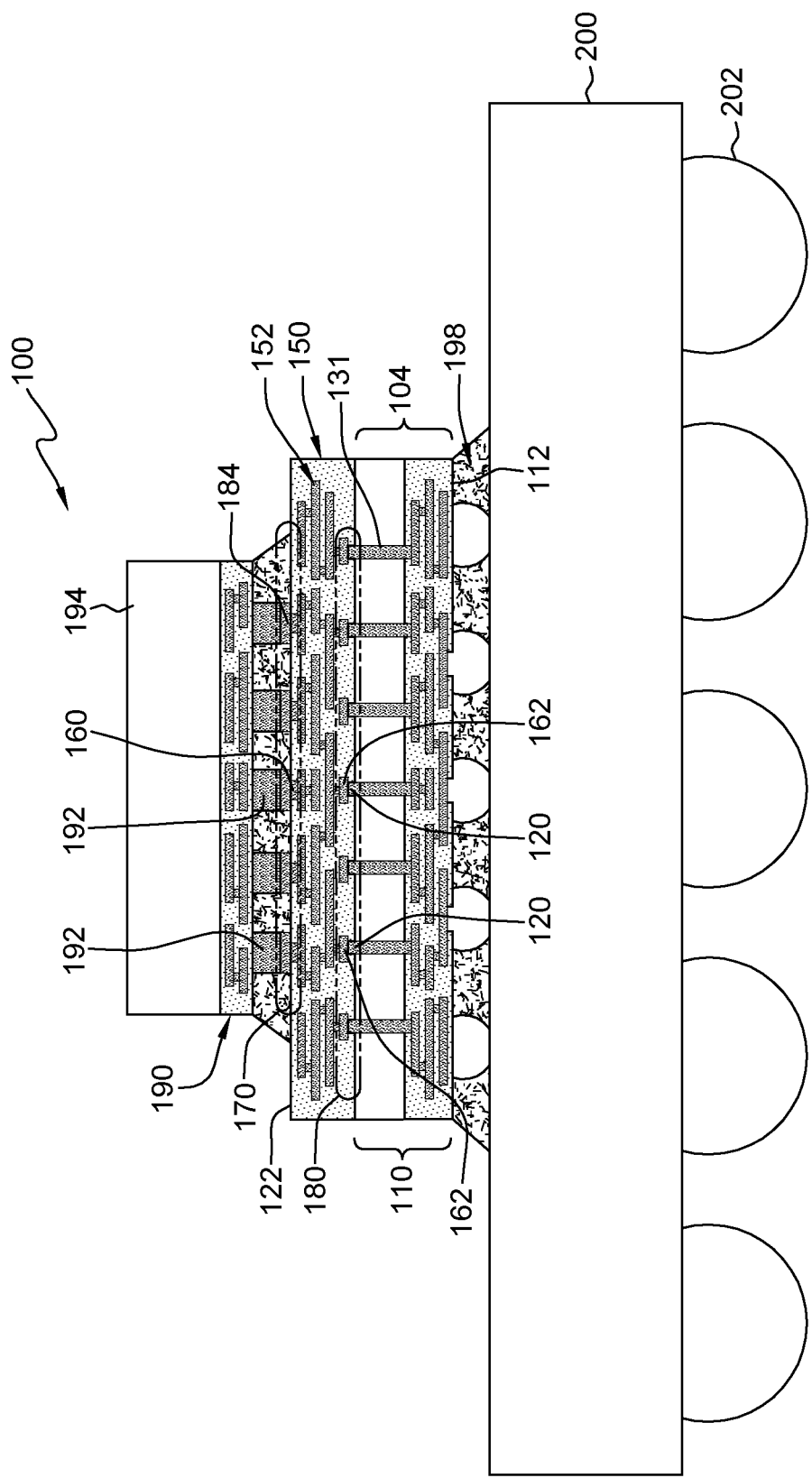
FIG. 13 shows a cross-sectional view of a step or steps of a method for making a 3D IC package and a 3D IC package so formed, according to embodiments of the disclosure.

FIG. 13 shows forming 3D IC chip package 100 according to embodiments of the disclosure. 3D IC chip package 100 may be formed by coupling plurality of top die interconnects 192 of IC top die 190 to UBM 184 on a selected IC bottom die 104. The coupling may be according to any now known or later developed chip packaging process, e.g., formation of micropillars on top die 190 and soldering to UBM 184. IC bottom die 104 may be coupled to any now known or later developed circuit board, e.g., with a controlled collapse chip connect (C4) layer 198, a ball grid array (BGA) laminate 200 and solder balls 202.

Figure 14:
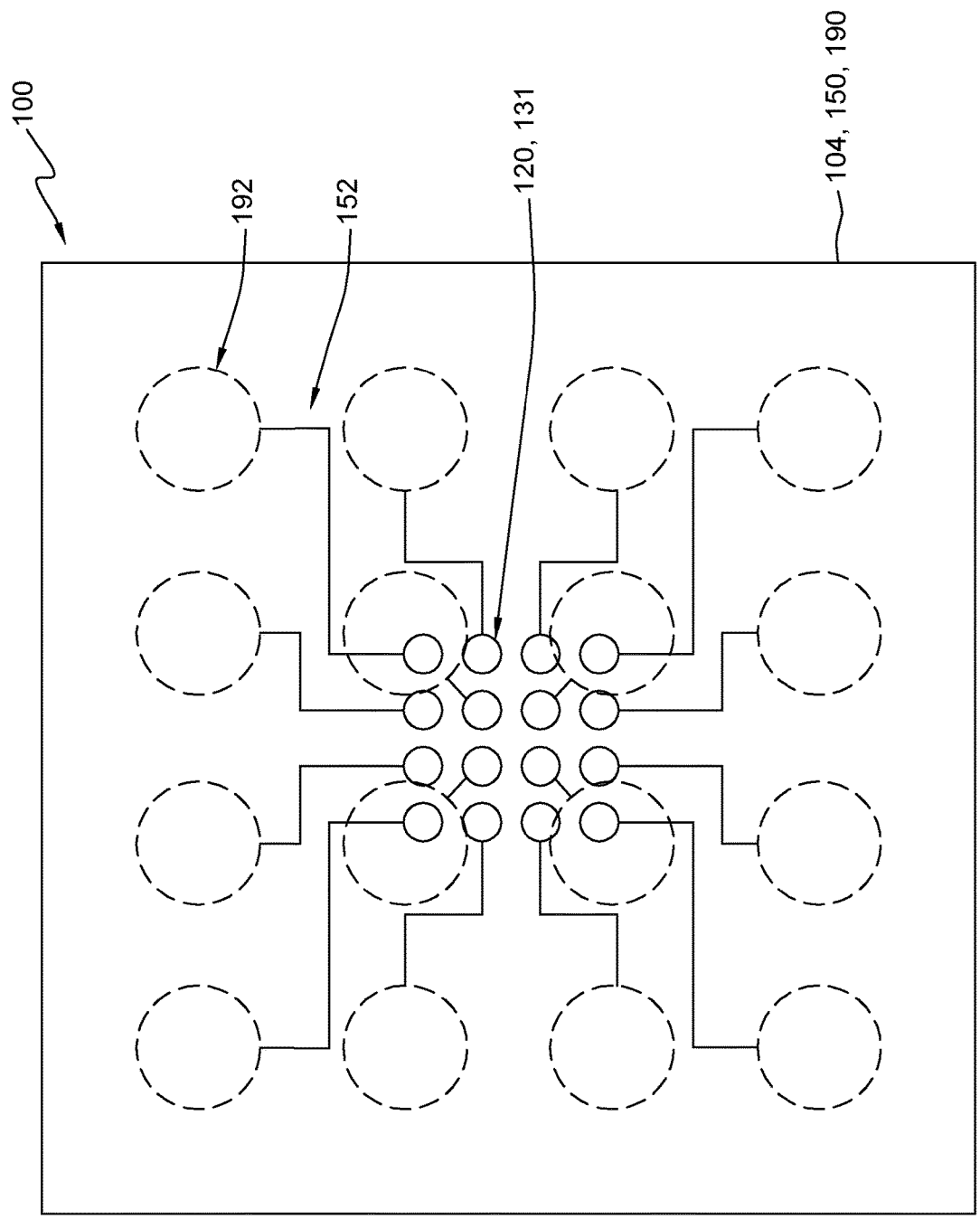
FIG. 14 shows a top schematic view of a 3D IC package according to embodiments of the disclosure.

In FIG. 13, first location 170 at which front side RDL interconnects 162 of interposer 150 couple to exposed bottom die interconnects 120 is aligned with, i.e., overlap, second location 180 at which back side RDL interconnects 160 of interposer 150 couple to top die interconnects 192, via UBM 184. That is, RDL 152 routes wiring within the footprint of top die 190 and/or bottom die 104. FIG. 14 shows a top schematic view of 3D IC chip package 100 electrical connections. In this example, bottom die 104, interposer 150 with RDL 152 and top die 190 are shown to have the same outer dimensions and are aligned; hence only one box is shown. It is understood that they may have different outer dimensions and still be aligned in accordance with this embodiment, e.g., FIG. 13. Here, in contrast to conventional structures, RDL 152 of interposer 150 enables integration of fine pitch interconnections, such as TSVs 131 (only a small number thereof shown) on back interconnect side 110 of bottom dies 104, with top die interconnections 192 that have larger pitch dimensions. Where TSV 131 placement on bottom die 104 is typically driven by top die 190 micropillar pitch, RDL 152 allows for "fan-in" of micropillar connections to a smaller TSV footprint area. For example, a top die 190 for a standard high bandwidth memory (HBM) may have approximately 6600 top die interconnections 192 in about 20 square millimeter (mm$^2$) footprint, forcing TSVs 131 of, for example, 5 micrometer (μm) diameter, on bottom die 104 to have an approximately 55 μm pitch. However, the same approximately 6600 top die interconnections 192, using RDL 152 may be reduced to a footprint of approximately 1.5 mm$^2$, i.e., front side RDL interconnections 162 are within that footprint. In this case, TSVs 131 of the same diameter on bottom die 104 may have an approximately 15 μm pitch. RDL 152 may include as many levels as necessary to accommodate the higher density routing.

Figure 15:
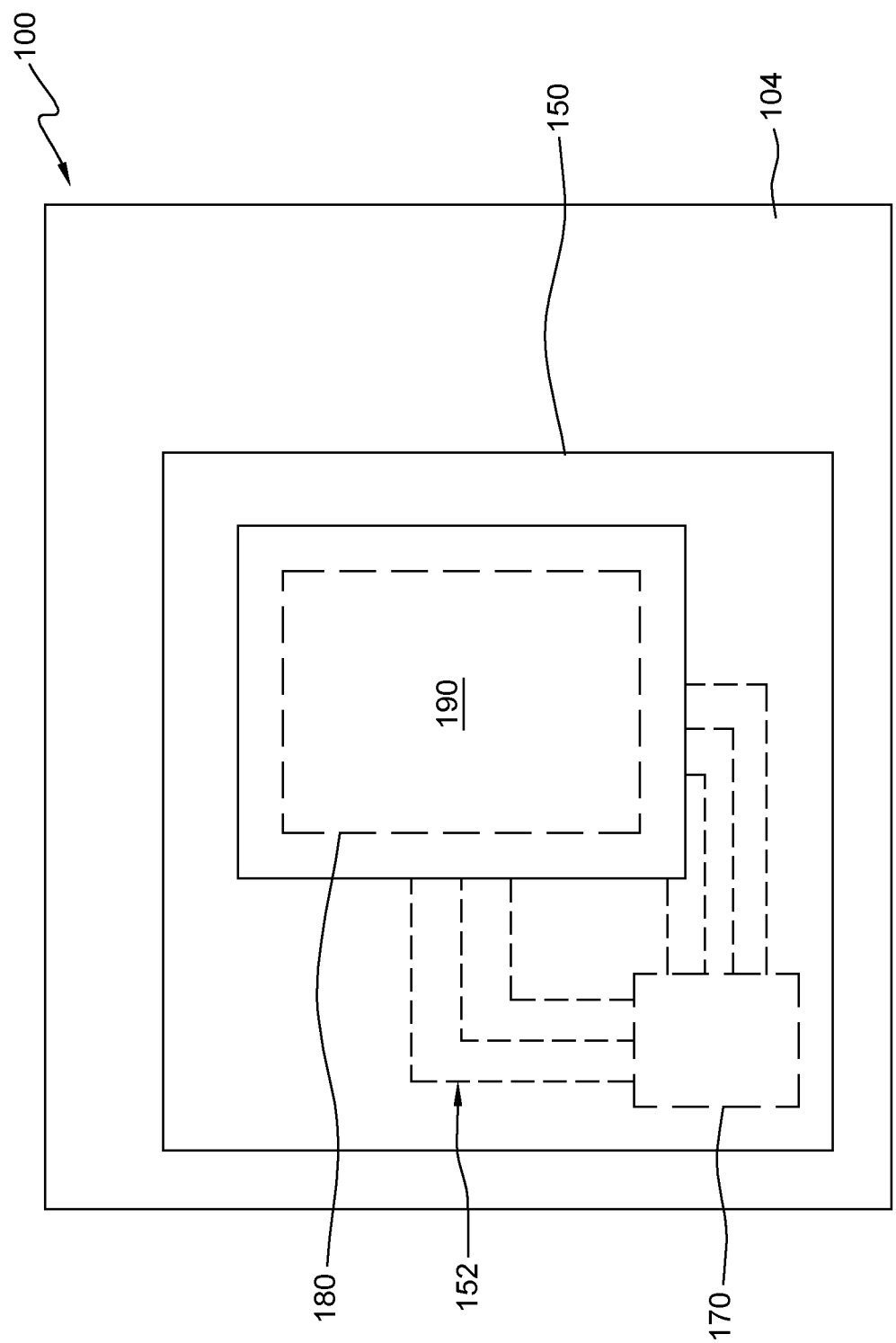
FIG. 15 shows a top schematic view of a 3D IC package according to other embodiments of the disclosure.

With reference to FIG. 15, a top schematic view of 3D IC chip package 100 electrical connections according to other embodiments is shown. Here, first location 170 at which front side RDL interconnects 162 (FIG. 13) of interposer 150 couple to bottom die interconnects 120 (FIG. 13) may not overlap, i.e., is not aligned with, second location 180 at which back side RDL interconnects 160 of interposer 150 couple to top die interconnects 192. That is, RDL 152 may route wiring outside the footprint of top die 190 and/or bottom die 104. Here, top die 190 may be placed in a different location than bottom die interconnects 120 with the ability to redistribute to top die interconnections 192, allowing for improved thermal solutions to be employed and a smaller footprint.

Regardless of embodiment, teachings of the disclosure are applicable to practically any technology node, including 7 nanometer (nm) products. Further, embodiments of the disclosure may be implemented on older technology nodes as 3D/TSV product adoption increases.

Returning to FIG. 13, 3D IC package 100 according to embodiments of the disclosure is shown. 3D IC package 100 may include bottom die 104 having back interconnect side 110 opposing a front device side 112. Back interconnect side 110 has a plurality of bottom die interconnects 120 extending thereto, which may each include TSVs 131.

3D IC package 100 may also include top die 190 having front device side 210 opposing a back side 212. Front device side 210 has a plurality of top die interconnects 192, which may include a micropillar arrangement configured to (size, pitch, etc.) electrically couple to UBM 184. Interposer 150, including RDL 152, may be positioned between IC bottom die 104 and IC top die 190. RDL 152 may include a plurality of wiring layers extending from back side RDL interconnects 160 thereof to front side RDL interconnects 162 thereof. As described herein, back side RDL interconnects 160 may have a larger pitch than front side RDL interconnects 162. Bottom die 104 may include back side dielectric layer 122 about the plurality of bottom die interconnects 120. As described, back side dielectric layer 122 may be bonded to dielectric layer 164 of interposer 150. A pad layer 144 (FIGS. 6 and 13) that includes plurality of bottom die interconnects 120 of the IC bottom die 104 may also be optionally provided. As described herein, interposer 150 and bottom die 104 may be hybrid bonded together.

3D IC package 100 may also include UBM 184 coupling back side RDL interconnects 154 to plurality of top die interconnects 192 at first location 170. Front side RDL interconnects 162 are coupled to plurality of bottom die interconnects 120 (i.e., TSVs 131 or pads 146) at second location 180, via UBM 184. As shown in FIGS. 13 and 14, first location 170 may overlap second location 180. Alternatively, as shown in FIG. 15, first location 170 may not overlap second location 180. Unless otherwise stated, any of the interconnections and/or wiring layers described herein may include copper as the conductor perhaps with any appropriate refractory metal line.

The method as described above is used in the fabrication of 3D IC packages. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A three dimensional (3D) integrated circuit (IC) package, comprising:
    an IC bottom die having a back interconnect side opposing a front device side, the back interconnect side having a plurality of bottom die interconnects extending thereto, wherein the bottom die interconnects each include through semiconductor vias (TSV), wherein the TSVs have an approximately 15 µm pitch;
    an IC top die having a front device side opposing a back side, the front device side having a plurality of top die interconnects, wherein the top die interconnects define a micropillar arrangement;
    an interposer including a redistribution layer (RDL) between the IC bottom die and the IC top die, the RDL including a plurality of wiring layers extending from back side RDL interconnects thereof to front side RDL interconnects thereof;
    an under bump metallization (UBM) coupling the back side RDL interconnects to the plurality of top die interconnects at a first location and the TSVs are configured to electrically couple to the UBM, and
    wherein the front side RDL interconnects are coupled to the plurality of bottom die interconnects at a second location.

2. The 3D IC package of claim 1, further comprising a back side dielectric layer about the plurality of bottom die interconnects on the IC bottom die, the back side dielectric layer bonded to a dielectric layer of the interposer.

3. The 3D IC package of claim 2, wherein the back side dielectric layer includes a wiring layer, the wiring layer including the plurality of bottom die interconnects of the IC bottom die.

4. The 3D IC package of claim 1, wherein the back side RDL interconnects have a larger pitch than the front side RDL interconnects.

5. The 3D IC package of claim 1, wherein the first location does not overlap the second location.

6. The 3D IC package of claim 1, wherein the first location overlaps the second location.

7. A three dimensional (3D) integrated circuit (IC) package, comprising:
    an IC bottom die having a back interconnect side opposing a front device side, the back interconnect side having a plurality of through semiconductor vias (TSVs) exposed therein wherein the TSVs have an approximately 15 µm pitch;
    an IC top die having a front device side, the front device side having a plurality of micropillars exposed therein;
    an interposer including a redistribution layer (RDL) between the IC bottom die and the IC top die, the RDL including a plurality of wiring layers extending from back side RDL interconnects thereof to front side RDL interconnects thereof;
    an under bump metallization (UBM) coupling the back side RDL interconnects to the plurality of top die interconnects at a first location,
    wherein the front side RDL interconnects are coupled to the plurality of bottom die interconnects at a second location, and
    wherein the back side RDL interconnects have a larger pitch than the front side RDL interconnects.

8. The 3D IC package of claim 7, wherein the first location does not overlap the second location.

* * * * *